(12) United States Patent
Makita et al.

(10) Patent No.: US 9,099,524 B2
(45) Date of Patent: Aug. 4, 2015

(54) DIE BONDER

(75) Inventors: Yoshiaki Makita, Kumagaya (JP);
Shingo Fukasawa, Kumagaya (JP)

(73) Assignee: FASFORD TECHNOLOGY CO., LTD., Minami-Alps (JP)

( * ) Notice: Subject to any disclaimer, the term of this patent is extended or adjusted under 35 U.S.C. 154(b) by 376 days.

(21) Appl. No.: 13/224,511

(22) Filed: Sep. 2, 2011

(65) Prior Publication Data
US 2013/0016205 A1 Jan. 17, 2013

(30) Foreign Application Priority Data

Jul. 13, 2011 (JP) ................................. 2011-154917

(51) Int. Cl.
*H01L 23/00* (2006.01)
(52) U.S. Cl.
CPC ............... *H01L 24/75* (2013.01); *H01L 24/83* (2013.01); *H01L 24/32* (2013.01); *H01L 2224/27312* (2013.01); *H01L 2224/2929* (2013.01); *H01L 2224/29339* (2013.01); *H01L 2224/29344* (2013.01); *H01L 2224/32225* (2013.01); *H01L 2224/32245* (2013.01); *H01L 2224/75611* (2013.01); *H01L 2224/75753* (2013.01); *H01L 2224/8385* (2013.01); *H01L 2224/83192* (2013.01); *H01L 2924/014* (2013.01)

(58) Field of Classification Search
CPC ................................ H05K 13/08; H01L 24/75
USPC ............................................ 348/87, E07.085
See application file for complete search history.

(56) References Cited

U.S. PATENT DOCUMENTS

| 4,543,659 | A | * | 9/1985 | Ozaki | .......................... | 382/145 |
| 5,166,753 | A | * | 11/1992 | Tokura | .......................... | 356/394 |
| 5,369,492 | A | * | 11/1994 | Sugawara | ..................... | 356/394 |
| 5,776,799 | A | | 7/1998 | Song et al. | | |

(Continued)

FOREIGN PATENT DOCUMENTS

| JP | 60-63937 U | 5/1985 |
| JP | 62-105436 A | 5/1987 |

(Continued)

OTHER PUBLICATIONS

English translation of Korean Office Action dated Oct. 9, 2012 (3 pages).

(Continued)

*Primary Examiner* — Sath V Perungavoor
*Assistant Examiner* — James Pontius
(74) *Attorney, Agent, or Firm* — Crowell & Moring LLP

(57) ABSTRACT

A die bonder that eliminates the need for moving a recognition camera for capturing an image related to adhesive application and achieves high reliability with high throughput is disclosed. The die bonder includes a lead frame; a syringe located above the lead frame and enclosing therein a paste adhesive; a recognition camera lateral to the syringe; an illumination lamp disposed in the vicinity of the recognition camera; and a reflector plate disposed opposite the illumination lamp. The reflector plate is adapted to reflect light from the illumination lamp onto the lead frame at an application surface of the paste adhesive. The recognition camera, illumination lamp, and reflector plate are arranged in a manner that the reflector plate is disposed on −Y side and the recognition camera and the illumination lamp are disposed on +Y side with respect to the syringe located above the lead frame transported in X direction.

10 Claims, 4 Drawing Sheets

(56) References Cited

U.S. PATENT DOCUMENTS

| | | | |
|---|---|---|---|
| 5,850,256 A * | 12/1998 | Corley | 348/187 |
| 6,661,544 B1 | 12/2003 | Okino et al. | |
| 8,107,675 B2 * | 1/2012 | Reuter | 382/103 |
| 8,351,682 B2 * | 1/2013 | Hayashi et al. | 382/147 |
| 8,493,520 B2 * | 7/2013 | Gay et al. | 349/15 |
| 2007/0153084 A1 * | 7/2007 | Deveau et al. | 348/126 |
| 2008/0024602 A1 * | 1/2008 | Linnenkohl et al. | 348/128 |
| 2008/0158365 A1 | 7/2008 | Reuter | |
| 2010/0177113 A1 | 7/2010 | Gay et al. | |
| 2010/0177947 A1 | 7/2010 | Hayashi et al. | |
| 2012/0214258 A1 * | 8/2012 | Kihara et al. | 438/5 |

FOREIGN PATENT DOCUMENTS

| | | |
|---|---|---|
| JP | 5-121512 A | 5/1993 |
| JP | 10-189623 A | 7/1998 |
| JP | 11-341223 A | 12/1999 |
| JP | 2001-127080 A | 5/2001 |
| JP | 2003-7734 A | 1/2003 |
| JP | 2003-224153 A | 8/2003 |
| JP | 2003-284990 A | 10/2003 |
| JP | 2004-288715 A | 10/2004 |
| JP | 2006-222521 A | 8/2006 |
| JP | 2008-311329 A | 12/2008 |
| JP | 3150529 U | 5/2009 |
| KR | 10-2009-0067857 A | 6/2009 |
| TW | 381332 B | 2/2000 |

OTHER PUBLICATIONS

English translation of Korean Office Action dated Feb. 21, 2013 (3 pages).

Japanese Office Action dated Jan. 27, 2015 with English-language translation (eight (8) pages).

* cited by examiner

FRONT SIDE

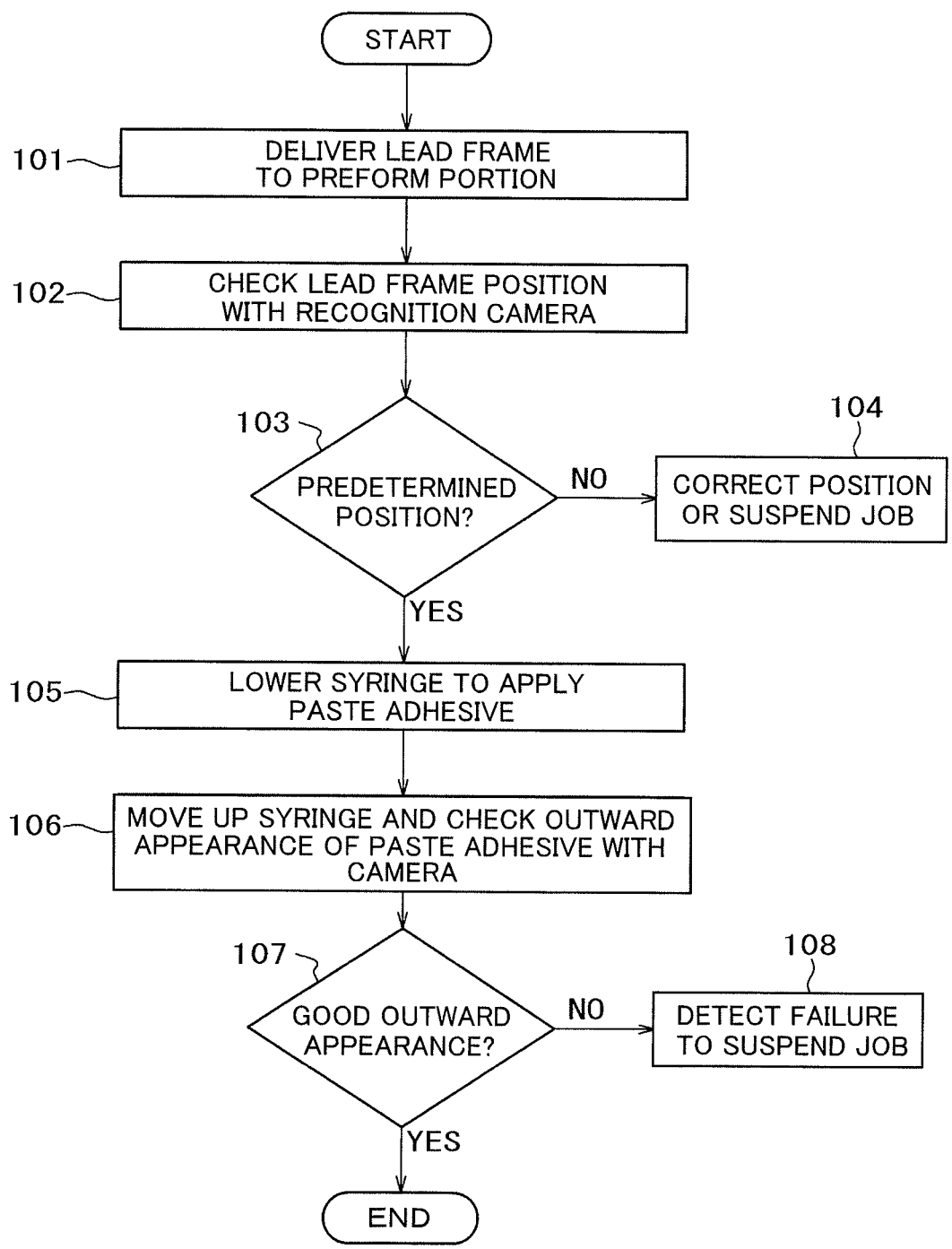

DIE BONDER

BACKGROUND OF THE INVENTION

1. Field of the Invention

The present invention relates to a die bonder.

2. Description of the Related Art

A die bonder is an apparatus which bonds a die (silicon wafer chip integrating electric circuits) to a lead frame, substrate or the like (hereinafter, referred to as "substrate") using solder, gold plate or resin as a bonding material. An engineering plastic is used as a die bond material (paste, film) for bonding the die and the substrate together. After positioning, the die is bonded to the lead frame or the like. A method of implementing bonding using a resin as the bonding material is now predominant.

In semiconductor die bonding, solder or resin paste for die bonding (Ag epoxy and Ag polyimide) is used as an adhesive for fixing a semiconductor chip (IC, LSI) to the lead frame, ceramic case, substrate or the like.

The adhesive for bonding the die to the substrate is applied by a syringe which is vertically movable and ejects a paste adhesive. Specifically, the syringe enclosing therein the paste adhesive applies a predetermined amount of adhesive to a predetermined place on the substrate.

In this regard, the syringe containing therein the paste adhesive and a pattern on the lead frame need be checked by capturing an image thereof with a recognition camera before a bonding operation is carried out. It is therefore a conventional practice to move the recognition camera to an imaging position for acquiring the image and to detect a proper bonding position before carrying out the bonding operation. After bonding, the recognition camera is moved again to the imaging position to acquire an image for determination as to whether the paste adhesive is properly applied or not.

In this manner, the conventional die bonder causes the recognition camera to make two runs to the imaging position for image acquisition each time the paste adhesive is applied to the lead frame. These are quite wasteful steps. Namely, the conventional die bonder involves an inefficient movement to lower throughput per unit time.

In addition, a clear image free from the moiré phenomenon is necessary for making an exact determination of an application position of the paste adhesive and an amount of applied paste adhesive, to thereby prevent product failure.

However, the above JP-A No.2001-127080 and JP-A No.2004-288715 do not give due consideration to the increase in the throughput of an adhesive application job although a camera for image recognition and an illumination element are provided.

SUMMARY OF THE INVENTION

It is an object of the invention to provide a die bonder that eliminates the need for an operation of moving a recognition camera for capturing an image related to adhesive application and achieves high reliability with high throughput.

According to an aspect of the invention, the above object is accomplished in a die bonder which comprises: a syringe located above a lead frame and enclosing therein a paste adhesive; a recognition camera fixed to place lateral to the syringe; an illumination element disposed in the vicinity of the recognition camera; and a reflector plate disposed in opposed relation to the illumination element, wherein the reflector plate reflects light from the illumination element onto a die at an application surface of the paste adhesive.

According to another aspect of the invention for achieving the above object, it is preferred that the recognition camera, the illumination element and the reflector plate are arranged in a manner that the reflector plate is disposed on a front side of the die bonder and the recognition camera and the illumination element are disposed on a back side of the die bonder with respect to the syringe located above the lead frame transported in X direction.

According to another aspect of the invention for achieving the above object, it is preferred that the illumination element is disposed below the recognition camera.

According to another aspect of the invention for achieving the above object, it is preferred that the illumination element is an illumination device including a plurality of LEDs arranged in a ring form and the illumination device surrounds an outside circumference of a lens of the recognition camera.

According to another aspect of the invention for achieving the above object, it is preferred that a reflective surface of the reflector plate is provided with a white matte coating.

According to another aspect of the invention for achieving the above object, it is preferred that the white matte coating has a thickness of 0.02 mm or more and 0.04 mm or less.

The object of the invention can be achieved by providing the die bonder that eliminates the need for the operation of moving the recognition camera for capturing the image related to adhesive application and achieves high reliability with high throughput.

BRIEF DESCRIPTION OF THE DRAWINGS

FIG. 6 is a flow chart showing the steps of an operation according to an embodiment of the invention.

DETAILED DESCRIPTION OF THE PREFERRED EMBODIMENTS

Preferred embodiments of the invention will hereinbelow be described with reference to the accompanying drawings.

First Embodiment

Figure 1:
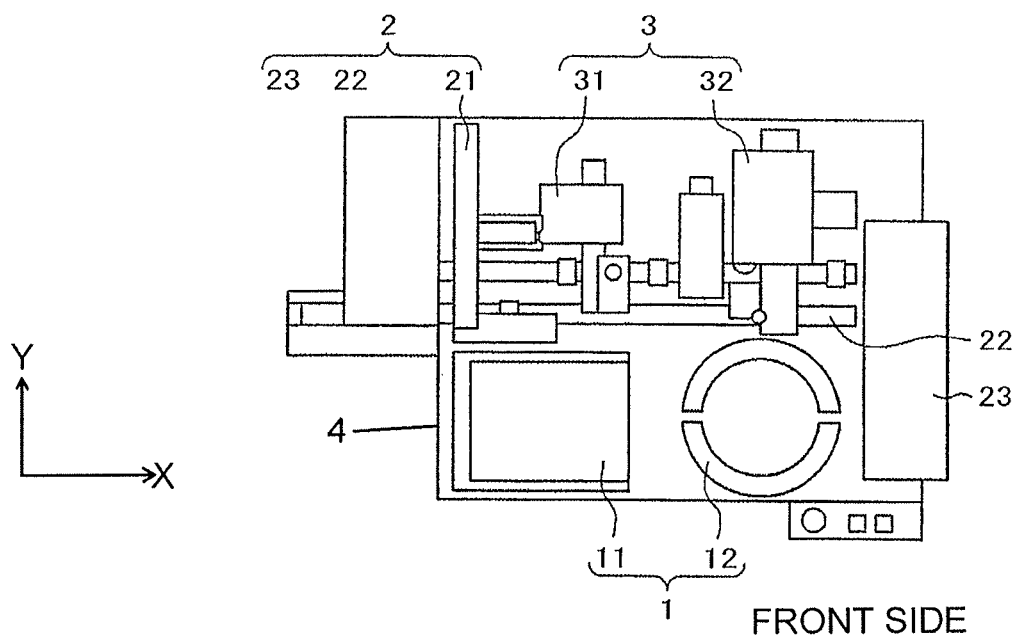
FIG. 1 is a conceptual diagram of a die bonder according to a first embodiment of the invention as seen from above.

FIG. 1 is a conceptual diagram of a die bonder according to a first embodiment of the invention as seen from above.

Referring to FIG. 1, a die bonder 10 principally includes a wafer feeder 1, a frame feeding/transporting portion 2 and a die bonding portion 3. The frame feeding/transporting portion 2 includes a stack loader 21, a frame feeder 22 and an unloader 23. A frame (hereinafter, referred to as "lead frame") supplied by the stack loader 21 to the frame feeder 22 is transported to the unloader 23 via two processing positions on the frame feeder 22.

The die bonding portion 3 includes a preform portion 31 and a bonding head portion 32. The preform portion 31, preceding the die bonding portion 3 in operation, applies a die attach adhesive (hereinafter, referred to as "paste adhesive") onto the frame delivered by the frame feeder 22. Picking up a die from a pickup device 12, the bonding head portion 32 is moved up and parallel, thus transferring the die to a bonding point above the frame feeder 22. The bonding head portion 32 lowers the die so as to bond the die onto the frame to which the paste adhesive is applied.

A recognition camera 33 is installed in the vicinity of the preform portion 31. The recognition camera 33 is used for recognizing a pattern on the lead frame and determining whether or not a predetermined amount of paste adhesive is applied to a predetermined position. As will be described hereinlater, the preform portion 31 is provided with a vertically movable syringe 36 at an upper part thereof. A paste adhesive 37 is enclosed within this syringe 36 so as to be ejected through a nozzle tip by air pressure.

The wafer feeder 1 includes a wafer cassette lifter 11 and the pickup device 12. The wafer cassette lifter 11 includes a wafer cassette loaded with wafer rings (not shown) for sequentially feeding the wafer rings to the pickup device 12.

The present inventors first investigated a fixing position of the recognition camera, and found a problem occurs in a case where the recognition camera is fixed in place on a front side of a main body 4 of the die bonder with respect to the syringe (on the −Y side of the preform portion as seen in FIG. 1).

Figure 2:
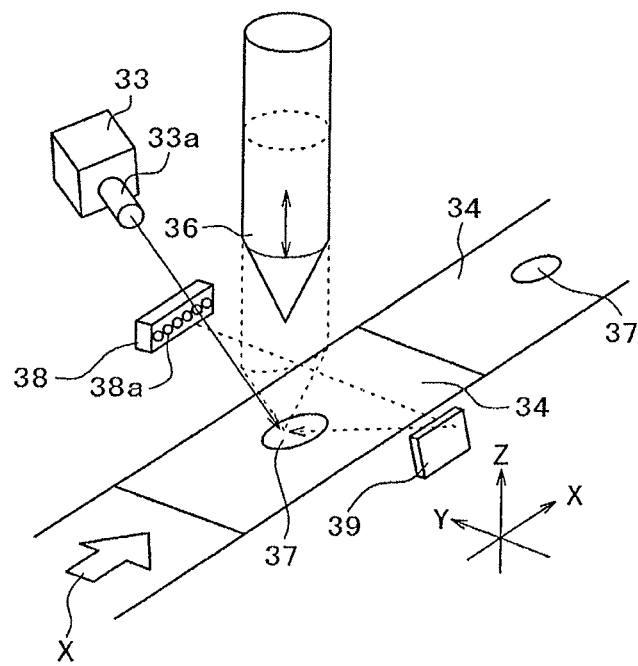
FIG. 2 is an external perspective view showing a preform portion according to the first embodiment of the invention.

Specifically, when replenishing the paste adhesive enclosed within the syringe, the syringe is extracted in the −Y direction as seen in FIG. 2 so that a work area for a worker to extract the syringe lies in the same direction as the recognition camera mentioned. Hence, if the recognition camera is located on the front side of the main body of the die bonder, it interferes with the syringe extracting job. Accordingly, the present inventors conducted various tests with the recognition camera fixed in place on the back side of the main body of the die bonder (on the +Y side of the preform portion as seen in FIG. 1) and arrived at the following embodiments.

FIG. 2 is an external perspective view showing the preform portion according to the first embodiment of the invention.

Referring to FIG. 2, a lead frame 34 is moved in the X direction indicated by an arrow in the figure. The syringe 36 is disposed above the lead frame 34. The paste adhesive 37 is enclosed within this syringe 36. With the syringe 36 moved up in Z direction, the recognition camera 33 is operated for determination of the position of the lead frame 34 and the amount of applied paste adhesive 37. This recognition camera 33 is fixed in an angled position so as to direct a lens 33a thereof to an application surface of the paste adhesive 37 at all times. An illumination lamp 38 is disposed under the recognition camera 33. The illumination lamp 38 includes a plurality of LEDs 38a. A reflector plate 39 is angularly disposed at place opposed to the illumination lamp 38 and reflects light from the illumination lamp 38 on the lead frame 34 at a pattern recognition surface or at the application surface of the paste adhesive 37.

The preform portion 31 having the above structure operates as follows to apply the paste adhesive.

Specifically, the lead frame 34 is moved from the X direction indicated by the arrow. The lead frame 34 stops when arriving at place directly under the syringe 36. Meanwhile an image captured by the fixed recognition camera 33 is checked to determine whether the lead frame 34 is stopped at a correct position or not. If it is determined that the stop position of the lead frame corresponds to a predetermined position, the syringe 36 is lowered to apply the paste adhesive 37 to a predetermined place on the lead frame 34. When the application of the paste adhesive 37 by the syringe 36 is done and the syringe 36 is moved up in the Z direction, the recognition camera 33 checks to determine whether a proper amount of paste adhesive 37 is applied or not, or whether dripping of the paste adhesive occurred or not. If it is determined that the proper amount of paste adhesive is applied without dripping, the operation proceeds to the next application job.

It is noted that the syringe 36 indicated by a dotted line in the figure represents a position to apply the paste adhesive while the one indicated by a solid line represents a position to which the syringe 36 is moved up (Z direction). That is, the figure illustrates a state where the syringe 36 is moved up so as not to block the light from the illumination lamp 38, allowing the recognition camera 33 to observe the amount of applied paste adhesive.

Figure 3:
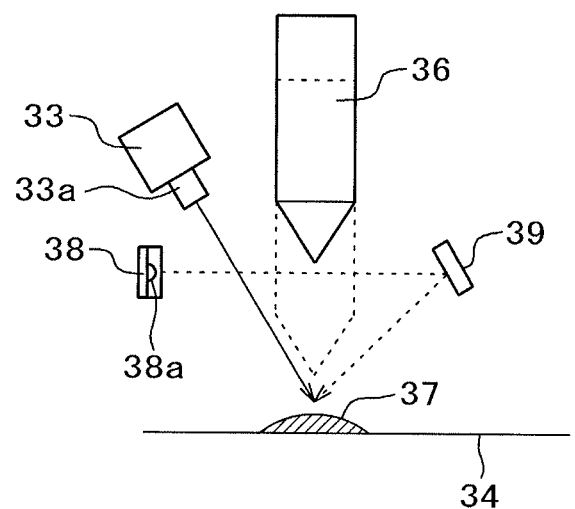
FIG. 3 is a schematic diagram showing a structure of the preform portion according to the first embodiment of the invention.

FIG. 3 shows the preform portion in side view.

Referring to FIG. 3, with the syringe 36 moved up, an area where the paste adhesive is applied is observed by the fixed recognition camera 33. At this time, the light from the illumination lamp 38 is applied toward the reflector plate 39 and reflected by this reflector plate 39 to illuminate the application surface of the paste adhesive, as indicated by a dotted line in the figure.

By the way, the illumination lamp 38 includes a plurality of LEDs (In this embodiment, an investigation was made using six LEDs). A reflector plate having a glossy surface (mirror polished surface) was provided to reflect the light from the illumination lamp 38 onto the lead frame 34 at the application surface of the paste adhesive. However, it was found that captured images sustained disturbances or distortion. This is the so-called moiré phenomenon on image or image distortion which occurs when periodic patterns overlap with each other.

After making various investigations on what caused the moiré phenomenon, the present inventors reasoned that the mirror polished reflector plate 39 was responsible for the moiré phenomenon. A white matte coating was applied to the reflector plate 39 (coating thickness on the order of 0.03 mm). As a result, favorable images free from the moiré phenomenon were obtained. Incidentally, the coating having thickness in the range of 0.02 to 0.04 mm affords favorable results.

Thus, this embodiment accomplishes the high-throughput adhesive application job by eliminating the need for moving the recognition camera for image acquisition. In addition, the embodiment can set the fixing position of the recognition camera in a place that is not affected by the removal of the syringe.

Furthermore, this embodiment can prevent the acquired images from being affected by the moiré phenomenon, thereby ensuring a reliable adhesive application.

Second Embodiment

Figure 4:
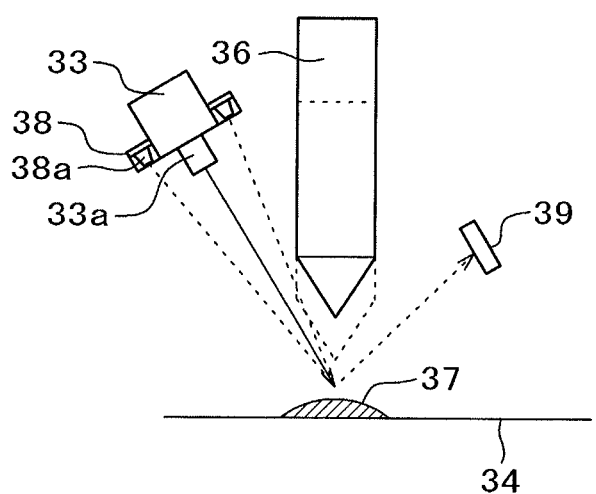
FIG. 4 is a schematic diagram showing a structure of a preform portion according to a second embodiment of the invention.

FIG. 4 is a schematic diagram showing a structure of a preform portion according to a second embodiment of the invention.

Referring to FIG. 4, the syringe 36 is disposed above the lead frame 34. This syringe 36 encloses therein the paste adhesive 37. With the syringe 36 moved up, the recognition camera 33 observes the position of the lead frame 34 or the amount of applied paste adhesive. A ring-like illumination lamp 38 is attached to an outside circumference of the lens 33a mounted in the recognition camera 33 (The lamp 38 will be specifically described with reference to FIG. 5). This illumination lamp 38 includes a plurality of LEDs 38a. The reflector plate is angularly disposed at place opposed to the illumination lamp 38 and reflects light from the illumination lamp 38 on the lead frame 34 at the pattern recognition surface or at the application surface of the paste adhesive 37.

The preform portion 31 having the above structure operates as follows to apply the paste adhesive.

Specifically, the lead frame 34 stops when arriving at place directly under the syringe 36. Meanwhile an image captured by the fixed recognition camera 33 is checked to determine whether the lead frame 34 is stopped at a correct position or not. If it is determined that the stop position of the lead frame corresponds to the predetermined position, the syringe 36 is lowered to apply the paste adhesive 37 to the predetermined place on the lead frame 34. When the application of the paste adhesive 37 by the syringe 36 is done and the syringe 36 is moved up, the recognition camera 33 checks to determine whether the proper amount of paste adhesive 37 is applied or not. When it is determined that the proper amount of paste adhesive is applied, the operation proceeds to the next application job.

It is noted that the syringe 36 indicated by the dotted line in the figure represents the position to apply the paste adhesive while the one indicated by the solid line represents the position to which the syringe 36 is moved up (Z direction). That is, the figure illustrates a state where the syringe 36 is moved up so as not to block the light from the illumination lamp 38, allowing the recognition camera 33 to observe the amount of applied paste adhesive.

Figure 5:
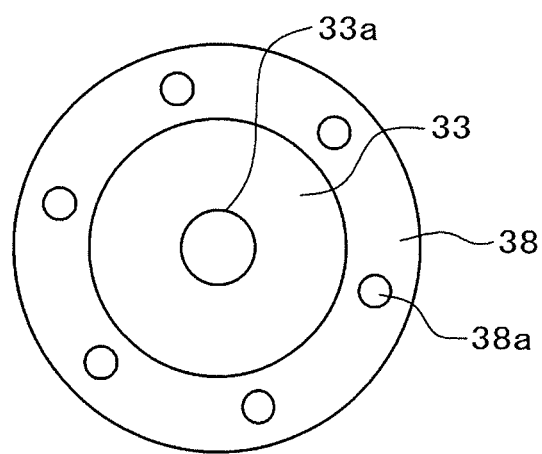
FIG. 5 is a front view showing an illumination device according to the second embodiment of the invention.

FIG. 5 is a front view showing an illumination device according to the second embodiment of the invention.

Referring to FIG. 5, the ring-like illumination lamp 38 is attached in a manner to surround the lens 33a of the recognition camera 33. This ring-like illumination lamp 38 is a single illumination device including a plurality of LEDs arranged in a case shaped like a ring (In this embodiment, the investigation was made using six LEDs).

Needless to say, this embodiment applied the white matte coating to the reflector plate 39 in order to prevent images captured by the recognition camera 33 from suffering from the moiré phenomenon.

According to this embodiment, a clear image free from the moiré phenomenon can be acquired because the ring-shaped illumination is provided to apply the light to the area of the applied adhesive in a focused way.

FIG. 6 is a flow chart showing the steps of an operation according to an embodiment of the invention.

In FIG. 6,

Step 101: With the lead frame delivered to the predetermined position, the preform portion prepares for the application of the paste adhesive.

Step 102: The recognition camera observes to check if the lead frame is delivered to the predetermined position.

Step 103: If any displacement of the lead frame is observed in the camera's field of view, an amount of displacement from the predetermined position is calculated so as to be used for correction of the position to apply the paste adhesive. If, on the other hand, the lead frame is displaced out of the camera's field of view or the position thereof is unrecognizable, an error is detected to suspend the job (Step 104).

Step 105: The syringe is lowered to apply the predetermined amount of paste adhesive onto the lead frame .

Step 106: When the syringe finished with the application of past adhesive is moved up, the recognition camera checks the condition of the applied paste adhesive.

Step 107: If the amount of applied paste adhesive is insufficient or abrasion is observed, an application job error is detected to suspend the job (Step 108). If it is determined that there is no problem, the step of applying the paste adhesive is completed.

According to the embodiment as described above, the predetermined amount of paste adhesive can be applied to the lead frame without displacement because the job of applying the paste adhesive is always monitored by the recognition camera. If the lead frame should be displaced, the application job error due to displacement will not occur because the displacement is corrected when the paste adhesive is applied.

In the event that the lead frame is displaced out of the camera's field of view, that the paste adhesive is applied in an amount other than the predetermined amount, or that abrasion on the adhesive application surface results from an insufficient amount of paste adhesive applied, the application job error is immediately detected to suspend the job. Hence, there is no fear of any defective product coming on the market.

According to the invention as described above, the need for moving the recognition camera is eliminated so that an increased throughput is achieved, leading to higher productivity. Further, the syringe becomes more maintainable because the nozzle tip of the syringe can be checked by the recognition camera.

Furthermore, the quality improvement can be achieved because the recognition camera also facilitates determination as to whether or not the paste adhesive is applied properly or checking for dripping. What is more, an even higher quality improvement can be achieved because the reflector plate of the embodiment affords the image free from moiré disturbance or distortion for checking of the application surface.

What is claimed is:

1. A die bonder comprising:
a syringe located above a lead frame and enclosing therein a paste adhesive;
a recognition camera fixed in place adjacent to the syringe and having a lens;
an illumination element disposed in the vicinity of the recognition camera; and
a reflector plate disposed in opposed relation to the illumination element;
wherein the reflector plate reflects light from the illumination element onto a die at an application surface of the paste adhesive;
wherein the recognition camera is fixed in an angled position so as to direct the lens thereof to the application surface of the paste adhesive or a position of the lead frame; and
wherein the recognition camera, the illumination element and the reflector plate are arranged so that the reflector plate is disposed on −Y side and the recognition camera and the illumination element are disposed on +Y side with respect to the syringe located above the lead frame transported in an X direction.

2. A die bonder comprising:
a syringe located above a lead frame and enclosing therein a paste adhesive;
a recognition camera fixed in place adjacent to the syringe and having a lens;
an illumination element disposed in the vicinity of the recognition camera; and
a reflector plate disposed in opposed relation to the illumination element;
wherein the reflector plate reflects light from the illumination element onto a die at an application surface of the paste adhesive;
wherein the recognition camera is fixed in an angled position so as to direct the lens thereof to the application surface of the paste adhesive or a position of the lead frame; and
wherein the recognition camera checks an outward appearance of the paste adhesive and, if it finds problems, outputs an application of job error.

3. The die bonder according to claim 2, wherein the illumination element is an illumination device including a plurality of LEDs arranged in a ring form, and the illumination device surrounds an outside circumference of a lens of the recognition camera.

4. A die bonder comprising:
a syringe located above a lead frame and enclosing therein a paste adhesive;
a recognition camera fixed in place adjacent to the syringe and having a lens;
an illumination element disposed in the vicinity of the recognition camera; and
a reflector plate disposed in opposed relation to the illumination element;
wherein the reflector plate reflects light from the illumination element onto a die at an application surface of the paste adhesive;
wherein the recognition camera is fixed in an angled position so as to direct the lens thereof to the application surface of the paste adhesive or a position of the lead frame; and
wherein the illumination element is an illumination device including a plurality of LEDs arranged in a ring form, and the illumination device surrounds an outside circumference of a lens of the recognition camera.

5. A die bonder comprising:
a syringe located above a lead frame and enclosing therein a paste adhesive;
a recognition camera fixed in place adjacent to the syringe and having a lens;
an illumination element disposed in the vicinity of the recognition camera; and
a reflector plate disposed in opposed relation to the illumination element;
wherein the reflector plate reflects light from the illumination element onto a die at an application surface of the paste adhesive;
wherein the recognition camera is fixed in an angled position so as to direct the lens thereof to the application surface of the paste adhesive or a position of the lead frame; and
wherein a reflective surface of the reflector plate is provided with a white matte coating.

6. The die bonder according to claim 5, wherein the white matte coating has a thickness of 0.02 mm or more and 0.04 mm or less.

7. An operation method for a die bonder that comprises a syringe located above a lead frame and enclosing therein a paste adhesive, a recognition camera fixed in place adjacent to the syringe, an illumination element disposed in the vicinity of the recognition camera, and a reflector plate disposed in opposed relation to the illumination element, comprising the step of reflecting light from the illumination element onto a die at an application surface of the paste adhesive while the recognition camera is fixed in an angled position so as to direct a lens thereof to the application surface of the paste adhesive or a position of the lead frame, wherein the recognition camera, the illumination element, and the reflector plate are arranged so that the reflector plate is disposed on −Y side and the recognition camera and the illumination element are disposed on +Y side with respect to the syringe located above the lead frame transported in an X direction.

8. An operation method for a die bonder that comprises a syringe located above a lead frame and enclosing therein a paste adhesive, a recognition camera fixed in place adjacent to the syringe, an illumination element disposed in the vicinity of the recognition camera, and a reflector plate disposed in opposed relation to the illumination element, comprising the steps of reflecting light from the illumination element onto a die at an application surface of the paste adhesive while the recognition camera is fixed in an angled position so as to direct a lens thereof to the application surface of the paste adhesive or a position of the lead frame, and checking an outward appearance of paste adhesive and, if problems are found, outputting an application of job error.

9. A die bonder comprising:
a syringe located above a lead frame and enclosing therein a paste adhesive;
a recognition camera fixed in place adjacent to the syringe and having a lens;
an illumination element disposed in the vicinity of the recognition camera; and
a reflector plate disposed in opposed relation to the illumination element;
wherein the reflector plate reflects light from the illumination element onto a die at an application surface of the paste adhesive;
wherein the recognition camera is fixed in an angled position so as to direct the lens thereof to the application surface of the paste adhesive or a position of the lead frame;
wherein the recognition camera is operated for determination of the position of the lead frame or determination of a predetermined amount of applied paste adhesive; and
wherein said recognition camera is operated for said determination with the syringe moved up.

10. An operation method for a die bonder that comprises a syringe located above a lead frame and enclosing therein a paste adhesive, a recognition camera fixed in place adjacent to the syringe, an illumination element disposed in the vicinity of the recognition camera, and a reflector plate disposed in opposed relation to the illumination element, comprising the step of reflecting light from the illumination element onto a die at an application surface of the paste adhesive while the recognition camera is fixed in an angled position so as to direct a lens thereof to the application surface of the paste adhesive or a position of the lead frame;
wherein the recognition camera is operated for determination of the position of the lead frame or determination of a predetermined amount of applied paste adhesive; and
wherein said recognition camera is operated for said determination with the syringe moved up.

* * * * *